(12) United States Patent
Geng et al.

(10) Patent No.: US 10,950,958 B2
(45) Date of Patent: Mar. 16, 2021

(54) MEMORY MODULE CONNECTOR, MEMORY MODULE, AND PIVOTABLE LATCH

(71) Applicant: Intel Corporation, Santa Clara, CA (US)

(72) Inventors: Phil Geng, Portland, OR (US); Xiang Li, Portland, OR (US); Mani Prakash, University Place, WA (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 16/021,269

(22) Filed: Jun. 28, 2018

(65) Prior Publication Data
US 2019/0044262 A1 Feb. 7, 2019

(51) Int. Cl.
| H01R 13/62 | (2006.01) |
| H01R 13/64 | (2006.01) |
| H01R 13/627 | (2006.01) |
| H01R 12/70 | (2011.01) |
| H05K 1/14 | (2006.01) |
| H01R 12/73 | (2011.01) |
| H05K 3/36 | (2006.01) |
| H01R 12/72 | (2011.01) |
| H05K 1/11 | (2006.01) |

(52) U.S. Cl.
CPC ..... *H01R 12/7023* (2013.01); *H01R 12/7029* (2013.01); *H01R 12/737* (2013.01); *H05K 1/141* (2013.01); *H05K 3/366* (2013.01); *H01R 12/721* (2013.01); *H05K 1/117* (2013.01); *H05K 2201/10159* (2013.01); *H05K 2201/10189* (2013.01); *H05K 2201/10393* (2013.01)

(58) Field of Classification Search
CPC ........ H01R 13/62938; H01R 13/62955; H01R 13/62933
USPC ......................................... 439/157, 372, 358
See application file for complete search history.

(56) References Cited

U.S. PATENT DOCUMENTS

| 5,387,115 A * | 2/1995 | Kozel | H01R 12/712 439/157 |
| 5,445,531 A * | 8/1995 | Billman | H01R 12/7005 439/157 |
| 5,584,705 A * | 12/1996 | Lin | H05K 7/1409 439/157 |
| 5,634,803 A * | 6/1997 | Cheng | H01R 13/62988 439/157 |
| 5,662,485 A * | 9/1997 | Yip | H05K 7/1409 439/157 |
| 6,039,595 A * | 3/2000 | Tseng | H01R 12/7011 439/157 |
| 6,059,585 A * | 5/2000 | Liao | H05K 7/1409 439/155 |
| 6,290,519 B1 * | 9/2001 | Lee | H01R 13/62988 439/157 |

(Continued)

*Primary Examiner* — Abdullah A Riyami
*Assistant Examiner* — Thang H Nguyen
(74) *Attorney, Agent, or Firm* — 2SPL Patent Attorneys PartG mbB; Yong Beom Hwang (57) ABSTRACT

A memory module connector includes a memory module receiving slot configured to receive a memory module. The memory module connector further includes a restraining mechanism configured to release the memory module if a force applied by the memory module to the restraining mechanism is above a pre-determined force threshold.

11 Claims, 8 Drawing Sheets

(56) References Cited

U.S. PATENT DOCUMENTS

| | | | | |
|---|---|---|---|---|
| 6,406,320 B1* | 6/2002 | Wu | ............... | H01R 13/6275 |
| | | | | 439/358 |
| 6,910,911 B2* | 6/2005 | Mellott | ............ | H01R 13/2421 |
| | | | | 439/358 |
| 7,955,098 B1* | 6/2011 | McKee | ........... | H01R 13/62988 |
| | | | | 439/157 |
| 8,834,188 B2* | 9/2014 | Wang | ............... | H01R 12/7029 |
| | | | | 439/157 |
| 9,033,724 B2* | 5/2015 | Lai | ............... | H01R 13/6271 |
| | | | | 439/328 |
| 2003/0148646 A1* | 8/2003 | Frantum, Jr. | ...... | H01R 12/7005 |
| | | | | 439/157 |
| 2007/0054536 A1* | 3/2007 | Nakamura | ........ | H01R 13/6392 |
| | | | | 439/353 |

* cited by examiner

MEMORY MODULE CONNECTOR, MEMORY MODULE, AND PIVOTABLE LATCH

FIELD

Examples relate to a memory module connector, a memory module, a pivotable latch, a method for a memory module connector, a method for forming a memory module connector and a method for forming a memory module, more specifically, but not exclusively, to releasing a memory module from a memory module connector if a force applied by the memory module to a restraining mechanism of the memory module connector is above a pre-determined force threshold.

BACKGROUND

Computer systems have an ever-increasing demand for volatile memory. For example, in server systems, volatile memory may be used to speed up system performance. Specifically adapted software, such as e.g. in-memory databases, may use vast amounts of volatile memory to perform with an increased performance. Such volatile memory is often provided by memory modules, which may be statically or removably connected to the computer system. If the memory modules are removably connected to the computer system, a memory module connector may be used to host the memory modules.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
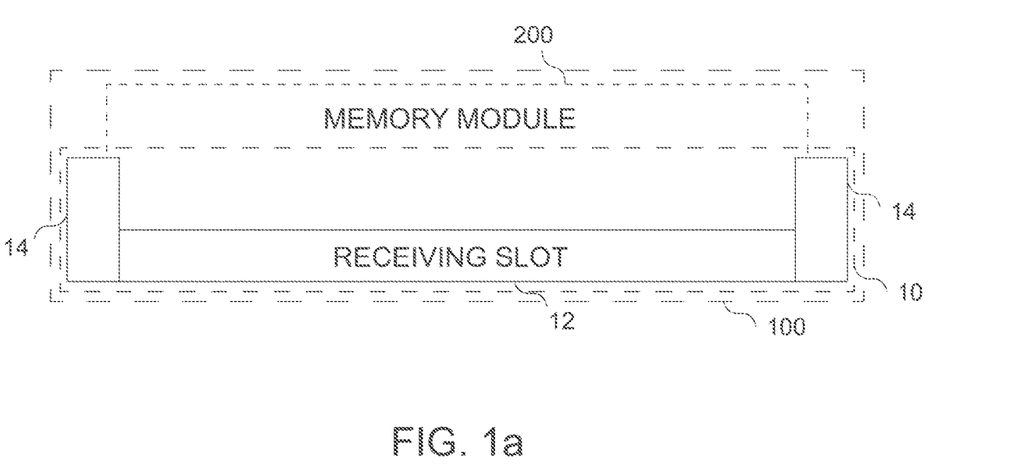
FIG. 1a shows a block diagram of an example of a memory module connector.
Figure 1B:
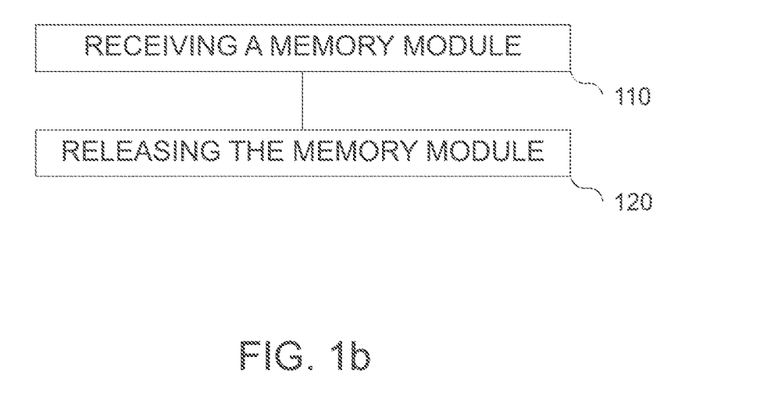
FIG. 1b shows a flow chart of an example of a method for a memory module connector.
Figure 1C:
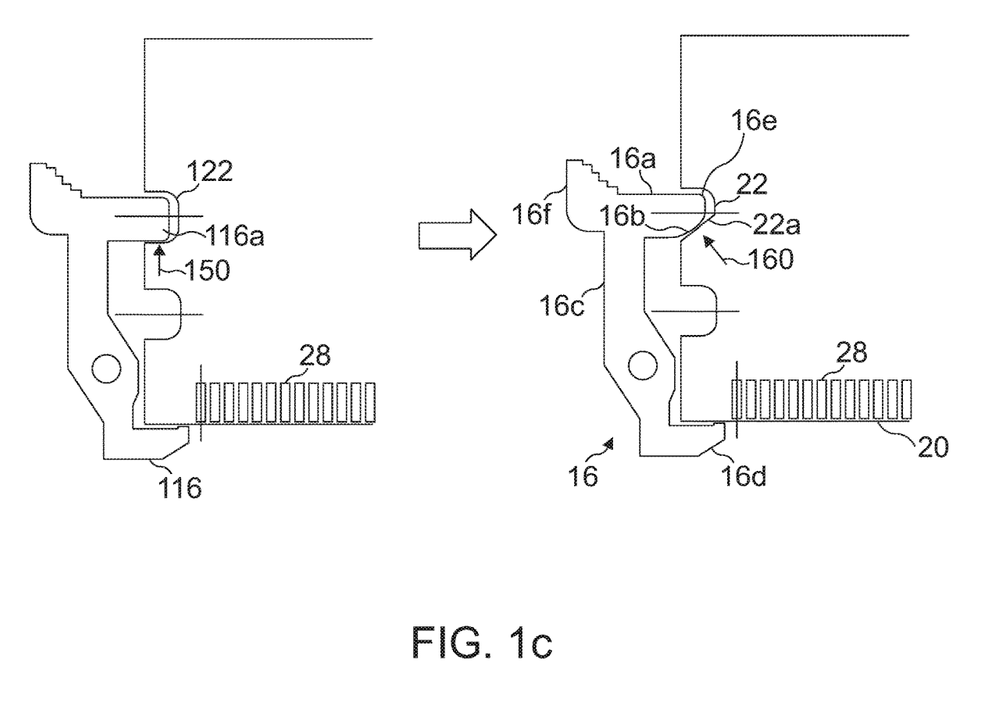
FIG. 1c shows a schematic comparison of a first memory module connector and a second memory module connector.

FIGS. 1a and 1c show block diagrams and schematic drawings of examples of a memory module connector 10. The memory module connector 10 corresponds to an apparatus 10 for connecting a memory module 20. The components of the apparatus 10 are defined as component means which correspond to the respective structural components of the memory module connector 10.

The memory module connector 10 comprises a memory module receiving slot 12 configured to receive a memory module 20. The memory module receiving slot 12 corresponds to a means for receiving a memory module 12 of the apparatus 10. The memory module connector 10 comprises a restraining mechanism 14 configured to release the memory module 20 if a force applied by the memory module 20 to the restraining mechanism 14 is above a pre-determined force threshold. The restraining mechanism 14 corresponds to a means for restraining 14 of the apparatus 10.

FIG. 1b shows a flow chart of an example of a corresponding method for a memory module connector 10. The method comprises receiving 110 a memory module 20. The method further comprises releasing 120 the memory module 20 if a force applied by the memory module 20 to a restraining mechanism 14 of the memory module connector 10 is above a pre-determined force threshold.

Releasing the memory module if the force is above the pre-determined threshold may avoid damaging the memory module connector if the memory module is subjected to a mechanical shock.

Figure 1D:
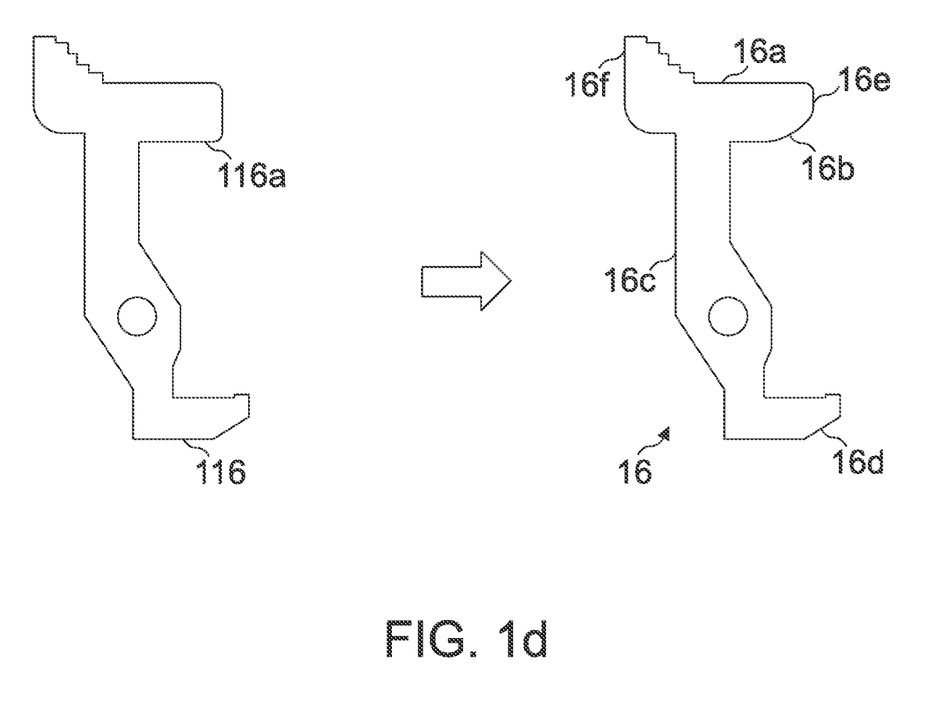
FIG. 1d shows a schematic comparison of a first pivotable latch and a second pivotable latch.

The following description relates to both the memory module connector 10 of FIGS. 1a, 1c and 1d and the method of FIG. 1b.

In at least some examples, the memory module connector 10 is a memory module connector for a Dual In-line Memory Module (DIMM). The memory module connector 10 may be a DIMM connector. The memory module connector 10 may be suitable for being attached to a printed circuit board (PCB), e.g. a mainboard/motherboard of a computer system. The memory module connector 10 may be a memory module connector 10 of a computer system. FIGS. 1a and 1b further show a PCB 100 (e.g. a mainboard or a motherboard of a computer system) comprising the memory module connector 10. The PCB may comprise a plurality of memory module connectors. Examples further provide a computer system 100 comprising the PCB 100 with the memory module connector 10. The computer system 100 may further comprise the memory module 20.

The memory module receiving slot 12 may be a slot for receiving (e.g. inserting or plugging in) the memory module 20. The memory module receiving slot 12 may comprise a plurality of signal contacts of the memory module connector 10. The plurality of signal contacts of the memory module connector 10 may be suitable for connecting the memory module connector 10 with a plurality of signal contacts 28 of the memory module 20.

The memory module receiving slot 12 may be configured to hold the memory module 20. In at least some examples, the memory module receiving slot comprises an oblong shape, wherein the memory module 20 is inserted along the oblong shape.

In at least some examples, the memory module 20 may be a Dual In-line Memory Module (DIMM). The memory module may comprise computer-readable memory, e.g. one or more memory chips. The memory may comprise read only memory (ROM) for storing data, programmable ROM (PROM), erasable PROM (EPROM), electrically EPROM (EEPROM), random access memory (RAM), dynamic RAM (DRAM), static RAM (SRAM), non-volatile storage, any semiconductor memory, and it may be arranged in any architecture using any technology, e.g. phase change memory (PCM), dynamic random access memory (DRAM), flash memory, or DDR (double data rate memory). The memory module 20 may be a volatile memory module, e.g. a Random Access Memory (RAM) module. Alternatively, at least a portion of the memory of the memory module 20 may be non-volatile memory, e.g. flash memory or persistent memory. The memory module 20 may be a non-volatile memory module. In at least some examples, the memory module connector 10 may be suitable for volatile memory (e.g. RAM) and non-volatile memory (e.g. persistent memory). The persistent memory may be based on Intel® 3D XPoint™. Intel and 3D XPoint are trademarks of Intel Corporation or its subsidiaries in the U.S. and/or other countries. In at least some examples, the memory module 20 comprises a printed circuit board for hosting the memory. The printed circuit board may comprise the notch 22.

In at least some examples, the restraining mechanism 14 may be configured to restrain (e.g. hold) the memory module 20 within the memory module receiving slot 12. The restraining mechanism 14 may comprise a first position, in which the memory module 20 is restrained within the memory module receiving slot 12, and a second position, in which the memory module 20 is released from the memory module receiving slot 12. The restraining mechanism 14 may comprise a holding portion (e.g. 16a) for restraining (holding) the memory module 20 within the memory module receiving slot. The restraining mechanism 14 may further comprise a lever portion for ejecting the memory module 20 from the memory module receiving slot 12.

The restraining mechanism 14 is configured to release the memory module 20 if the force applied to the restraining mechanism is above a pre-determined force threshold. For example, the restraining mechanism 14 may be configured to unblock or vacate the memory module 20 if the force applied to the restraining mechanism is above the pre-determined force threshold. The restraining mechanism 14 may be configured to remove a holding portion of the restraining mechanism from a notch of the memory module 20 if the force applied to the restraining mechanism is above the pre-determined force threshold. For example, the force may be directed in a direction the memory module 20 is released to from the memory module receiving slot 12. The force may be orthogonal to an elongated shape of the memory module receiving slot 12 or orthogonal to a PCB hosting the memory module connector 10. The force may be based on or may be a momentum of the memory module 20. The restraining mechanism 14 may be formed such, that the restraining mechanism is pushed aside by the memory module 20 if the force applied to the restraining mechanism is above the pre-determined force threshold. For example, the restraining mechanism 14 may be configured to release the memory module 20 if a shock force is applied to the printed circuit board. The shock force may be above the pre-determined force threshold.

In at least some examples, the force is applied by the memory module (e.g. a notch surface of the memory module (directly and/or only) to the restraining mechanism (e.g. a pivotable latch 16 or a holding portion surface 16b). For example, the force may push against the restraining mechanism 14. The restraining mechanism 14 may be released (e.g. unlocked or opened) if the force applied by the memory module 20 to the restraining mechanism 14 is above the pre-determined force threshold. The pre-determined force threshold may be chosen, so that the restraining mechanism 14 is configured to restrain the memory module 20 during normal operation, and so that the restraining mechanism 14 is configured to release the memory module 20 if a shock force is applied to a Printed Circuit Board the memory module connector is attached to.

In at least some examples, as shown in FIGS. 1c and 1d, the restraining mechanism 14 comprises at least one pivotable latch 16 (e.g. at least one hinged latch, at least one rotatable latch). The at least one pivotable latch 16 may be used to restrain or release the memory module 20. Each pivotable latch 16 may comprise an oblong portion 16c, a holding portion 16a, a lever portion 16d, a handle 16f and/or a hinge. The at least one pivotable latch 16 may be a single piece, e.g. a Monobloc. The oblong portion 16c may be (substantially) orthogonal to a main surface of the printed circuit board if the at least one pivotable latch 16 is in a first position. The oblong portion 16c of the at least one pivotable latch 16 may be located between the lever portion 16d of the at least one pivotable latch 16 and a handle 16f of the at least one pivotable latch 16. The holding portion 16a may extend from an elongated side of the oblong portion 16c. For example, the restraining mechanism may comprise two pivotable latches. The two pivotable latches may be located at either lateral end of the memory module receiving slot 12. The at least one pivotable latch 16 may be configured to lock into a notch 22 of the memory module 20 (see e.g. FIGS. 1c and 2b). For example, the two pivotable latches may be configured to lock into two notches of the memory module 20.

In at least some examples, the at least one pivotable latch 16 is configured to move between a first position and a second position (e.g. a "closed" position and an "open"

position). The first position of the at least one pivotable latch 16 may be suitable for restraining (e.g. holding or locking) the memory module within the memory receiving slot. The second position of the at least one pivotable latch 16 may be suitable for releasing (e.g. unlocking or ejecting) the memory module from the memory module receiving slot 12. For example, in the first position of the at least one pivotable latch 16, a holding portion of the at least one pivotable latch 16 may be configured to restrain or hold the memory module 20 within the memory module receiving slot 12. In the second position of the at least one pivotable latch 16, the holding portion of the at least one pivotable latch may be configured to release (e.g. free or unlock) the memory module from the memory module receiving slot 12. In some examples, the at least one pivotable latch 16 may comprise a lever portion 16*d* configured to eject the memory module 20 from the memory module receiving slot 12 (and the memory module connector 10) if, when or while the at least one pivotable latch 16 is in the second position.

The at least one pivotable latch 16 may be configured to move from the first position to the second position if a force applied from a notch 22 of the memory module 20 to the at least one pivotable latch 16 is above the pre-determined force threshold. For example, the at least one pivotable latch 16 may be formed such, that the force pushes the at least one pivotable latch 16 aside if the force is above the pre-determined force threshold.

In various examples, (each of) the at least one pivotable latch 16 comprises a holding portion 16*a*. For example, the two pivotable latches may each comprise a holding portion. The holding portion 16*a* may be configured to lock into a notch 22 of the memory module 20 if the at least one pivotable latch 16 is in the first position. For example, the holding portion 16*a* may be configured to engage with the notch 22 of the memory module 20 if the if the at least one pivotable latch 16 is in the first position. The holding portion 16*a* may be a portion of the at least one pivotable latch 16 to be inserted into the notch 22 of the memory module 20.

The holding portion 16*a* may comprise a holding portion surface 16*b* configured to restrain the memory module 20 if, when or while the at least one pivotable latch 16 is in the first position. In at least some examples, the holding portion 16*b* is configured to be in contact with the notch of the memory module 20 if, when or while the at least one pivotable latch 16 is in the first position. For example, the holding portion surface 16*b* may be a part of the surface of the holding portion 16*a* configured to be in contact with the memory module 20 if, when or while the at least one pivotable latch 16 is in the first position. The holding portion surface 16*b* may be located at a side of the holding portion 16*a* vertically facing the memory module receiving slot 12. The holding portion may comprise a further surface adjacent to the holding portion surface 16*b* to facilitate inserting the at least one pivotable latch 16 into the notch of the memory module 20. In at least some examples, the holding portion surface 16*b* is set back from a tip (e.g. a front or foremost part) 16*e* of the holding portion. The further surface may be located between the tip 16*e* of the holding portion and the holding portion surface 16*b*.

In various examples, the holding portion surface 16*b* is non-orthogonal to an oblong portion 16*c* of the at least one pivotable latch 16. In other words, the holding portion surface 16*b* may be non-parallel to a main surface of the printed circuit board. The holding portion surface 16*b* may form a single uniform shape. For example, the holding portion surface 16*b* may be slanted. In other words, an angle between the main surface of the printed circuit board and the holding portion surface 16*b* may be larger than 1° (or larger than 2°, larger than 5°, larger than 10°, larger than 15°, larger than 20°, larger than 30°, larger than 45°, larger than 60°, larger than 75°). The holding portion surface 16*b* may form a slope. In at least some examples, e.g. if the angle between the main surface of the printed circuit board and the holding portion surface 16*b* is larger than 1° (or larger than 2°, larger than 5°, larger than 10°, larger than 15°, larger than 20°, larger than 30°, larger than 45°, larger than 60°, larger than 75°), the pre-determined force threshold may be based on an angle between the printed circuit board and the holding portion surface 16*b*.

Alternatively, the holding portion surface 16*b* may be rounded (see e.g. FIG. 1*e*). For example, the holding portion surface 16*b* may form a convex shape. In at least some examples, the convex shape of the holding portion surface 16*b* may be matched to a concave shape of a notch surface 22*a* of a notch 22 of the memory module 20. In more general terms, the holding portion surface 16*b* may be matched to a notch surface 22*a* of the notch 22 of the memory module 20. For example, an angle of the holding portion surface 16*b* may be matched to an angle of the notch surface 22*a* of the notch 22 of the memory module 20.

If the holding portion surface 16*b* is non-orthogonal, e.g. non-parallel, slanted, rounded or sloped, the force may be used to push the at least one pivotable latch 16 aside if the force is above the pre-determined force threshold.

FIG. 1*c* shows a schematic comparison of a first memory module connector and a second memory module connector. FIG. 1*c* may show how the latch interaction force (e.g. the force) may be changed from a vertical direction to a slanted direction.

The first memory connector (on the left) comprises a pivotable latch 116 with a holding portion 116*a* comprising an orthogonal holding portion surface, which is inserted into a notch 122 of a memory module. The force (illustrated by arrow 150) is applied from an orthogonal surface of the notch 122 to the orthogonal surface of the holding portion 116*a*. The latch may lock the memory module in position and the force may transfer to the connector, which may be damaged if the force is above the pre-defined threshold.

The second memory connector (e.g. the memory module connector 10 according to at least some examples) comprises at least one pivotable latch 16 with a holding portion 16*a* comprising a non-orthogonal holding portion surface 16*b*. The force (illustrated by arrow 160) is applied from an non-orthogonal surface 22*a* of a notch 22 of the memory module 20 slantwise to the non-orthogonal holding portion surface 16*b*. The latch may open and the memory module (e.g. DIMM) may pop up instead of damaging the connector.

FIG. 1*d* shows a schematic comparison of a first pivotable latch and a second pivotable latch. FIG. 1*d* may show the (DIMM) connector latch and memory model notch design changes (between the first pivotable latch and the second pivotable). This may allow more DIMM connector/board flexural deformation and reduce damage to DIMM connectors. FIG. 1*d* shows the first pivotable latch 116 on the left with a holding portion 116*a* comprising an orthogonal holding portion surface. The second pivotable latch 16 on the right comprises a holding portion 16*a* with a non-orthogonal holding portion surface 16*b*. In FIG. 1*d*, the holding portion surface 16*b* is rounded.

For example, the vertical direction and a vertical dimension or thicknesses of components may be measured orthogonal to a main surface of the a PCB hosting the memory module connector 10, orthogonal to a largest extension of the memory module receiving slot 12, and/or orthogonal to a longest side of the memory module 20 and a lateral direction and lateral dimensions may be measured in parallel to a main surface of the a PCB hosting the memory module connector 10, in parallel to a largest extension of the memory module receiving slot 12, and/or in parallel to a longest side of the memory module 20.

More details and aspects of the memory module connector 10, the apparatus 10, the method and the memory module 20 are mentioned in connection with the proposed concept or one or more examples described below (e.g. FIGS. 2a to 7). The memory module connector 10, the apparatus 10, the method and the memory module 20 may comprise one or more additional optional features corresponding to one or more aspects of the proposed concept or one or more examples described above or below.

Figure 2A:
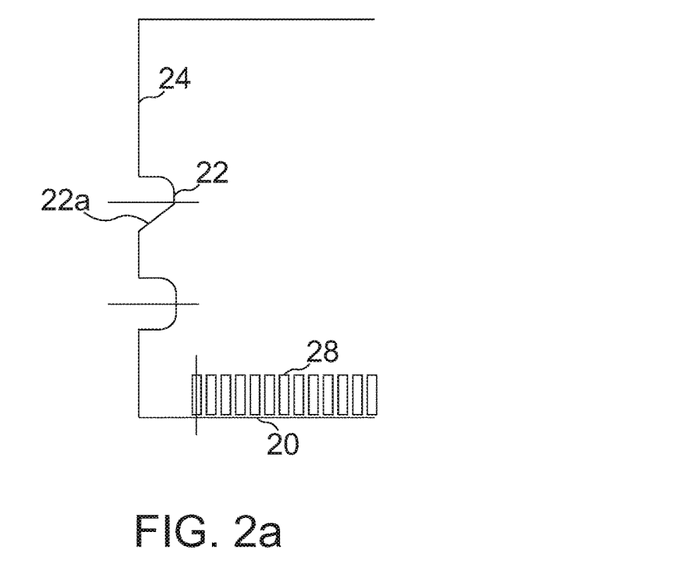
FIG. 2a shows a block diagram of an example of a memory module.

FIG. 2a shows a block diagram of a memory module 20 suitable for being inserted into a memory module receiving slot 12 of a memory module connector 10. The memory module 20 is suitable for being inserted into a means for receiving a memory module 12 of an apparatus 10. The memory module 20 comprises at least one notch 22 suitable for inserting a restraining mechanism 14 of the memory module connector 10. The at least one notch 22 comprises a notch surface 22a configured to be in contact with the restraining mechanism 14 of the memory module connector 100. The notch surface 22a is non-orthogonal to a side 24 of the memory module 20 comprising the at least one notch 22.

The memory module 20 is suitable for being inserted into the memory module receiving slot 12 of the memory module connector 10. For example, outer dimensions of the memory module 12 may match inner dimensions of the memory module receiving slot 12. The memory module 20 may be a memory module for the memory module connector 10. The memory module 20 may be connected to the memory module connector 10, e.g. by inserting the memory module 20 into the memory module receiving slot 12. The memory module 20 may be held by the restraining mechanism 14, e.g. the at least one pivotable latch 16.

In various examples, the at least one notch suitable for inserting a restraining mechanism 14 of the memory module connector 10 may comprise two notches. The two notches may be located at opposing sides of the memory module 20. For example, in a two-dimensional drawing of the memory module, the memory module may comprise four sides. The memory module may comprise a substantially oblong shape. A first side and a second side of the memory module 20 may comprise a first larger length (e.g., the first side and the second side may be long sides), and a third side and a fourth side of the memory module 20 may comprise a second shorter length (e.g. the third side and the fourth side may be short sides). The at least one notch may be located at a side of the memory module having the second shorter length, e.g. at a short side of the memory module 20. For example, if the memory module comprises two notches suitable for inserting a restraining mechanism 14 of the memory module connector 10, the two notches may be located at the third side and at the fourth side of the memory module 20 (e.g. at the short sides of the memory module 20). The first side and the second side may form opposing sides of the memory module 20, and the third side and the fourth side may form opposing sides of the memory module 20.

In at least some examples, the at least one notch (e.g. each notch) comprises a depth of more than 1 mm (or more than 2 mm, more than 3 mm, more than 4 mm, more than 5 mm). The at least one notch (e.g. each notch) may comprise a depth of less than 10 mm (or less than 8 mm, less than 6 mm). The at least one notch (e.g. each notch) comprises a depth of more than 1 mm (or more than 2 mm, more than 3 mm, more than 4 mm, more than 5 mm). The at least one notch (e.g. each notch) may comprise a height/width of more than 1 mm (or more than 2 mm, more than 3 mm, more than 4 mm, more than 5 mm). The at least one notch (e.g. each notch) may comprise a width/height of less than 10 mm (or less than 8 mm, less than 6 mm). The depth may be measured from the side 24 of the memory module towards a center point of the memory module. The width may be measured along the side 24 of the memory module. In at least some examples, the side 24 may comprise a further notch 26, which might not be suitable for inserting the restraining mechanism 14 of the memory module connector 10.

The at least one notch 22 comprises a notch surface 22a configured to be in contact with a restraining mechanism 14 of the memory module connector 100. In various examples, the notch surface 22a may be located at a side of the notch 22 (vertically) facing a plurality of signal contacts 28 of the memory module. The notch surface 22a may stretch from the side 24 of the memory module towards a back (e.g. lateral end) of the notch 22. In at least some examples, the notch surface might not reach the back of the notch 22. The notch 22 may comprise a further surface located between the notch surface 22 and the back of the notch.

The notch surface 22a is non-orthogonal to a side 24 of the memory module 20 comprising the at least one notch 22. In other words, the notch surface 22a may be non-parallel to a side of the memory module 20 comprising a plurality of signal contacts 28 of the memory module 20. The notch surface 22a may form a single uniform shape. For example, the notch surface 22a may be slanted. In other words, an angle between a side of the memory module 20 comprising the plurality of signal contacts 28 of the memory module 20 and the notch surface 22a may be larger than 1° (or larger than 2°, larger than 5°, larger than 10°, larger than 15°, larger than 20°, larger than 30°, larger than 45°, larger than 60°, larger than 75°). The notch surface 22a may form a slope towards the back of the notch 22.

Alternatively, the notch surface 22a may be rounded. For example, the notch surface 22a may form a concave shape. In at least some examples, the concave shape of the notch surface 22a may be matched to a convex shape of a holding portion surface 16b of a holding portion 16 of the at least one pivotable latch 16 of the memory module connector. In more general terms, the notch surface 22a may be matched to a holding portion surface 16b of a restraining mechanism 14 of the memory module connector. For example, an angle of the notch surface 22a may be matched to an angle of the holding portion surface 16b of a holding portion 16 of at least one pivotable latch 16 of the memory module connector.

If the notch surface 22a is non-orthogonal, e.g. non-parallel, slanted, rounded or sloped, the force may be used to push the at least one pivotable latch 16 aside if the force is above the pre-determined force threshold.

Figure 2B:
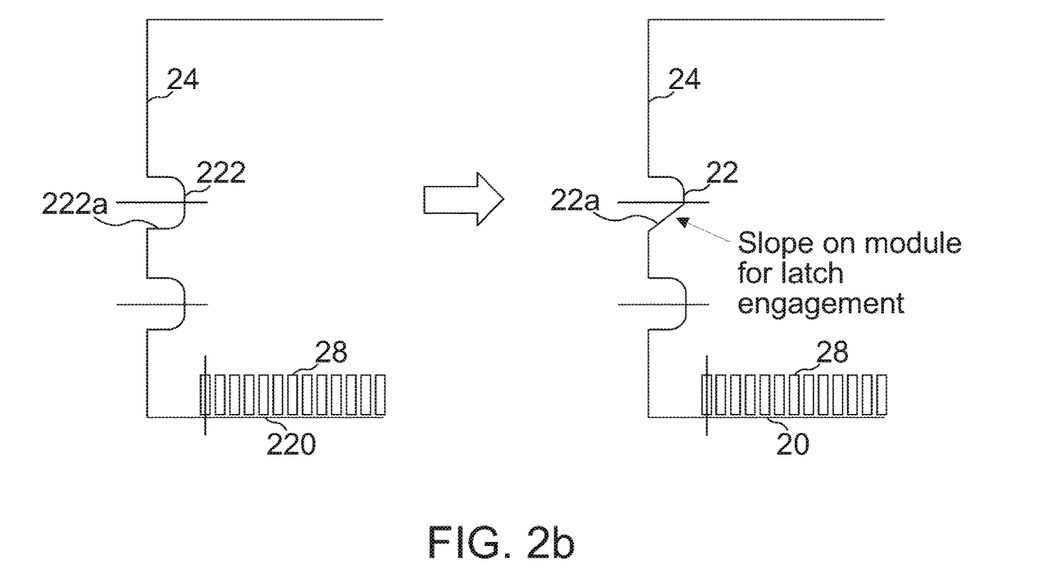
FIG. 2b shows a schematic comparison of a first memory module and a second memory module.

FIG. 2b shows a schematic comparison of a first memory module and a second memory module. FIG. 2b may show a memory module notch slope of a design of some memory modules and of a design according to at least some examples. FIG. 2b may illustrate the connector latch and memory model notch design changes. The first memory module 220 (on the left) comprises a notch 222 with an orthogonal notch surface 222a. In comparison, the second memory module 20 (on the right), e.g. the memory module 20 according to examples, comprises a notch 22 with a non-orthogonal notch surface 22a, e.g. with a slope on module for latch engagement. The notch 22 is located at a short side 24 of the memory module 20. The side 24 may further comprise a further notch 26, which might not be suitable for inserting the restraining mechanism 24. The memory module 28 further comprises a plurality of signal contacts. the plurality of signal contacts may be located at a long side of the memory module 20.

Examples further comprise a (computer) system comprising the memory module connector 10 (or the apparatus 10 for connecting a memory module) and the memory module 20.

More details and aspects of the memory module connector 10, the apparatus 10, the method and the memory module 20 are mentioned in connection with the proposed concept or one or more examples described above or below (e.g. FIG. 1a to 1d, 3 to 5). The memory module connector 10, the apparatus 10, the method and the memory module 20 may comprise one or more additional optional features corresponding to one or more aspects of the proposed concept or one or more examples described above or below.

Examples may comprise a DIMM (Dual In-line Memory Module) connector with angled latch retention for shock and vibration risk mitigation with heavy DIMM mass.

With the increase of memory capacity and the increase of DIMM heat spreader mass, a board level shock test may become high risk. Examples may provide a DIMM connector with angled latch retention for shock and vibration risk mitigation with heavy DIMM mass.

Figure 3:
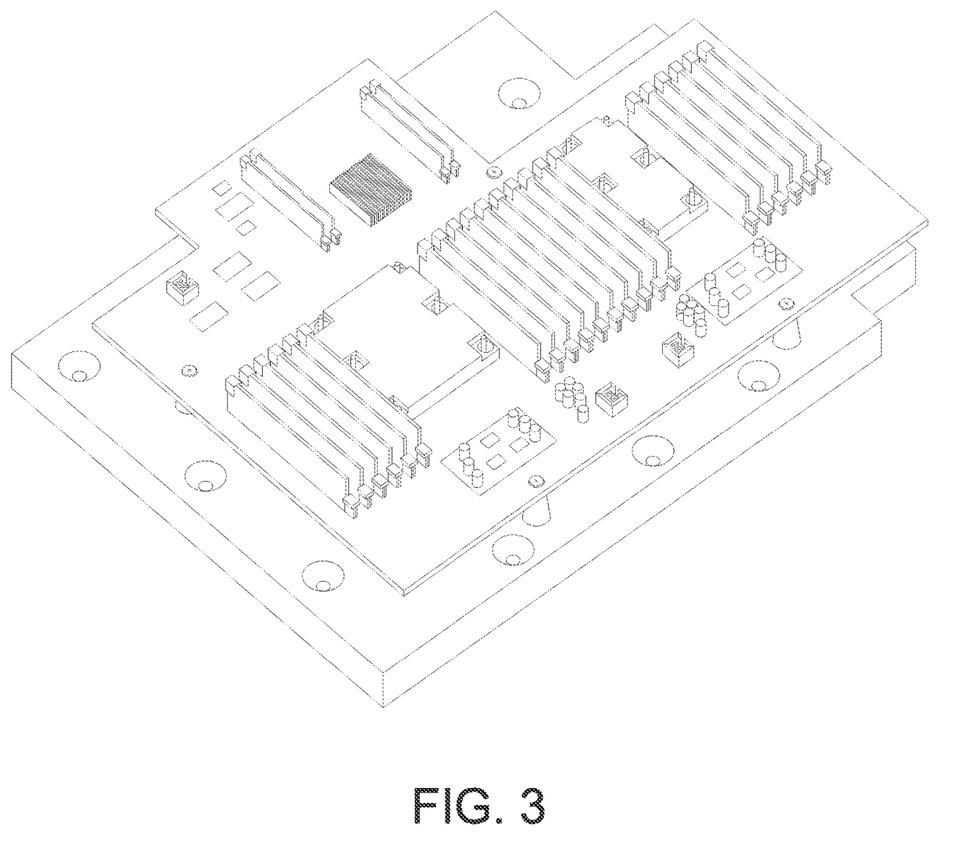
FIGS. 3 to 5 show schematic diagrams of failures of memory module connectors occurring during board level shock tests.
Figure 4:
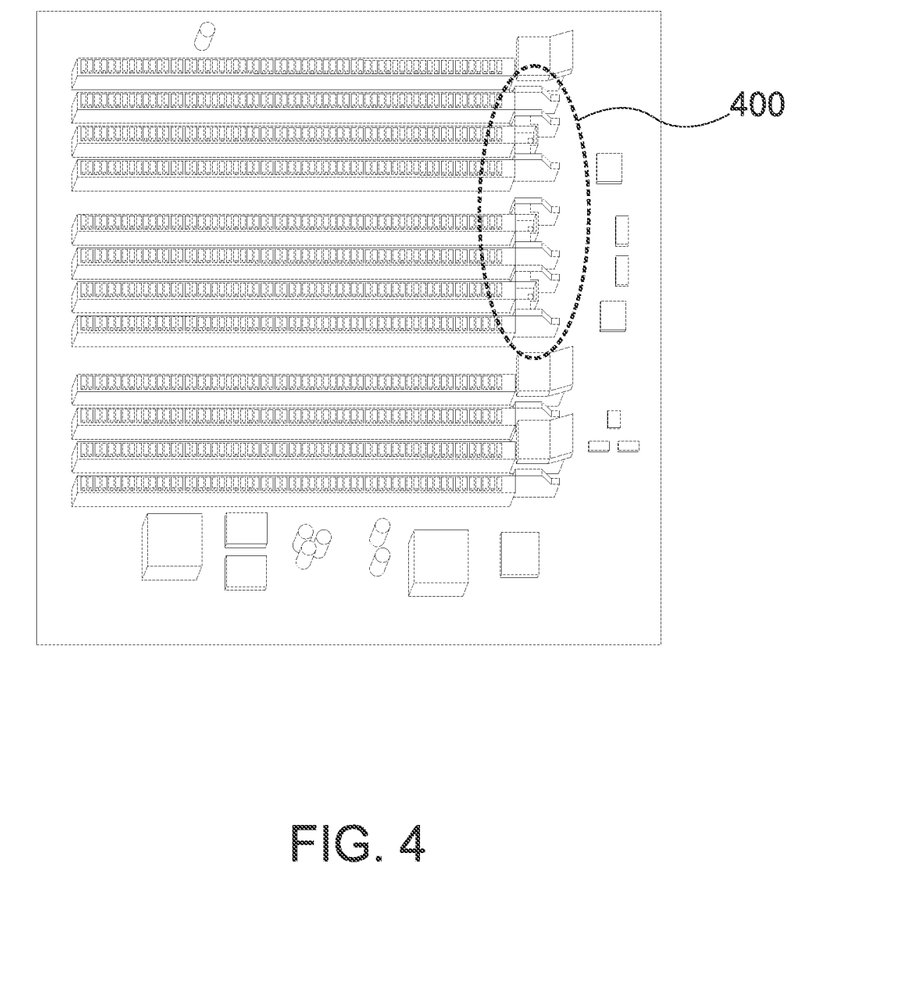
Figure 5:
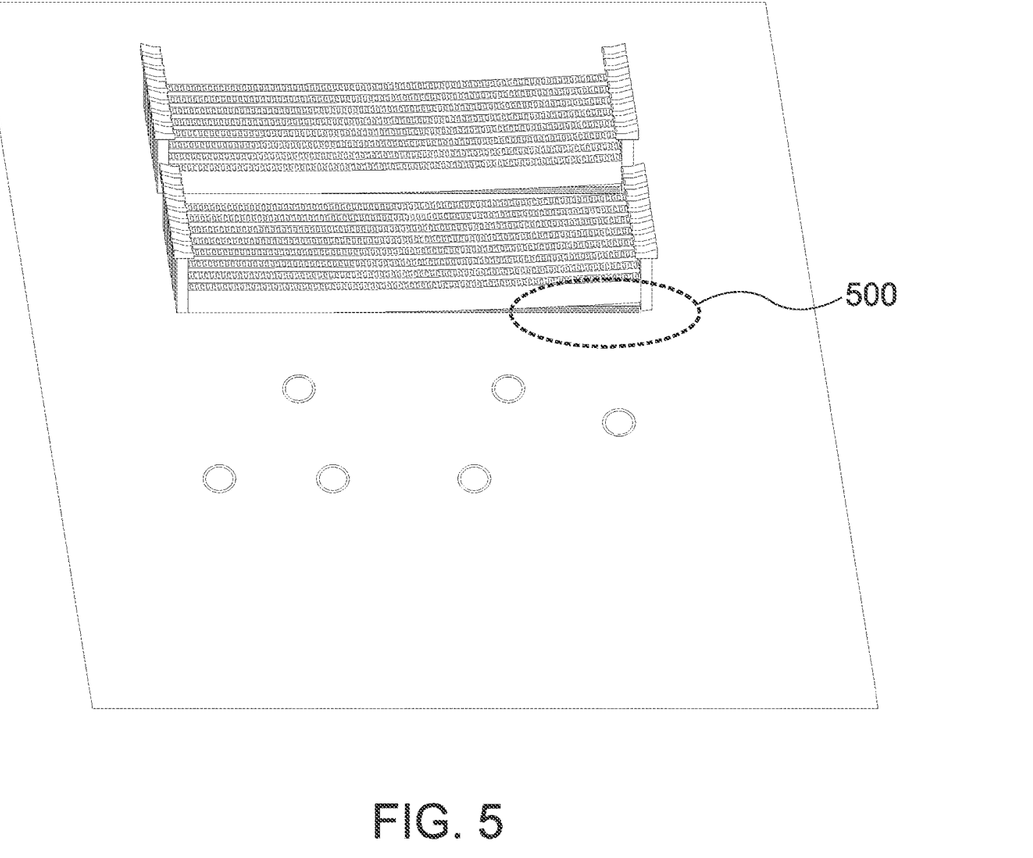

FIGS. 3 to 5 show schematic diagrams of failures of memory module connectors occurring during board level shock tests. FIG. 3 shows a (spread core) board level shock test configuration with DIMMs. The common DIMM connector failures under shock comprise a broken latch 400, as shown in FIG. 4. FIG. 4 illustrates common DIMM connector latch failures. With a more robust design for the DIMM latch, shock failure mode may be change to DIMM connector solder joint J-lead pulling out of connector housing, as shown in FIG. 5. FIG. 5 500 illustrates solder joint J-lead pulling out of a DIMM connector housing during shock test. Both observed failure modes may have the same root cause of heavy DIMM mass.

For future memory, the DIMM mass is expected to increase due to increased thermal power. The shock risk may continue to increase for DIMM connector failure and a solution at component level is needed urgently.

At least some systems may include dampers on a back side of a motherboard at system level to absorb shock impact. This approach may require more design and test effort to achieve the risk mitigation. Alternatively or alternatively, the test procedure may be changed. A shock requirement may be relaxed from a board level to a system level (e.g. from 50 G to 25 G). This may result in more tests for different system configurations. In some systems, the board boundary condition may be changed by adding/re-arranging mounting holes. This may sacrifice routing and compromise electrical performance. At least some approaches might not resolve board level shock risk. They may require a system level test with different typical chassis designs and may not cover for all system designs when dampers are used.

Instead of focusing on overall system solution, at least some examples focus on DIMM connector latch design. By introducing an angled latch (e.g. the at least one pivotable latch 16a of the restraining mechanism 16), examples may allow a DIMM to slip from a DIMM connector latch under shock load. This may allow more board flexure and reduce potential DIMM connector damage. Also, DIMM pop out may be visible and might be easily re-seated, if any.

At least some examples may eliminate DIMM connector damage under shock load, saving cost for any system level solutions (dampers, etc.) with no impact to routing.

More details and aspects of the memory module connector 10, the apparatus 10, the method and the memory module 20 are mentioned in connection with the proposed concept or one or more examples described above or below (e.g. FIG. 1a to 2b, 6 or 7). The memory module connector 10, the apparatus 10, the method and the memory module 20 may comprise one or more additional optional features corresponding to one or more aspects of the proposed concept or one or more examples described above or below.

Figure 6:
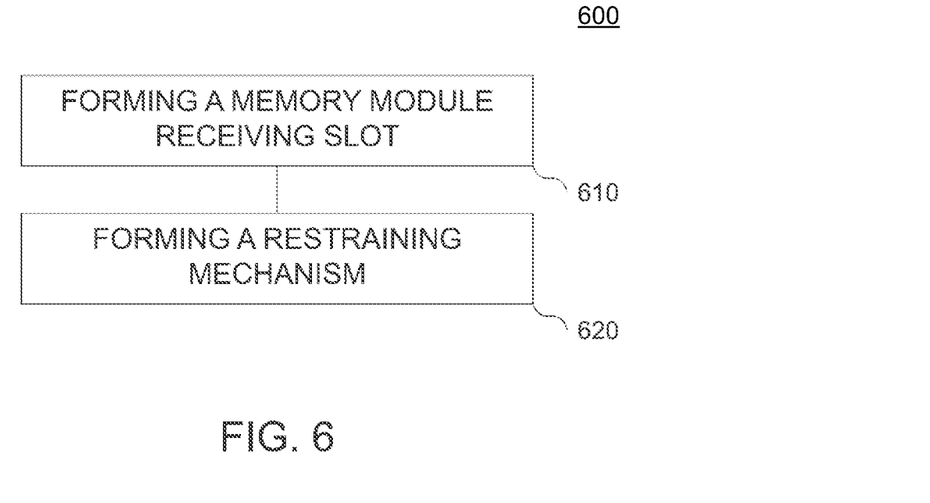
FIG. 6 shows a flow chart of an example of a method for forming a memory module connector.

FIG. 6 shows a flow chart of an example of a method 600 for forming a memory module connector 10. The method 600 comprises forming 610 a memory module receiving slot 12 configured to receive a memory module 20. The method 600 further comprises forming 620 a restraining mechanism 14 configured to release the memory module 20 if a force applied by the memory module 20 to the restraining mechanism 14 is above a pre-determined force threshold.

Figure 7:
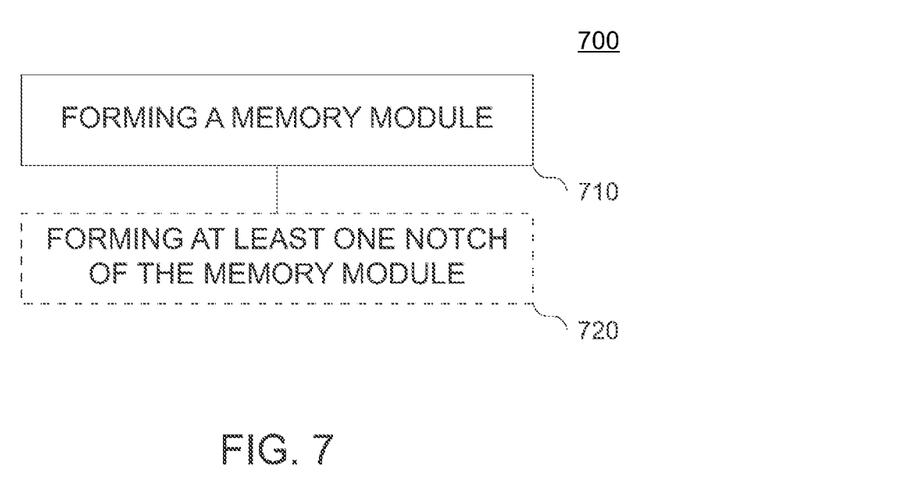
FIG. 7 shows a flow chart of an example of a method for forming a memory module.

FIG. 7 shows a flow chart of an example of a method 700 for forming a memory module 20. The memory module 20 is suitable for being inserted into a memory module receiving slot 12 of a memory module connector 10. The method comprises forming 710 the memory module 20. The memory module 20 comprises at least one notch 22 suitable for inserting a restraining mechanism 14 of the memory module connector 10. The method may comprise forming 720 (e.g. cutting, drilling, etching and/or sawing) the at least one notch 22. The at least one notch 22 comprises a notch surface 22a configured to be in contact with the restraining mechanism 14 of the memory module connector 100. The notch surface 22a is non-orthogonal to a side 24 of the memory module 20 comprising the at least one notch 22.

Example 1 relates to a memory module connector 10 including a memory module receiving slot 12 configured to receive a memory module 20. The memory module connector 10 includes a restraining mechanism 14 configured to release the memory module 20 if a force applied by the memory module 20 to the restraining mechanism 14 is above a pre-determined force threshold.

Example 2 may include the subject matter of example 1, wherein the memory module connector 10 is suitable for being attached to a printed circuit board, wherein the restraining mechanism 14 is configured to release the memory module 20 if a shock force is applied to the printed circuit board.

Example 3 may include the subject matter of one of the previous claims, wherein the force is directed in a direction the memory module 20 is released to from the memory module receiving slot 12.

Example 4 may include the subject matter of one of the previous claims, wherein the restraining mechanism 14 includes at least one pivotable latch 16.

Example 5 may include the subject matter of example 4, wherein the at least one pivotable latch 16 is configured to move between a first position and a second position, wherein the first position of the at least one pivotable latch 16 is suitable for restraining the memory module within the memory receiving slot, wherein the second position of the at least one pivotable latch 16 is suitable for releasing the memory module from the memory module receiving slot 12, and wherein the at least one pivotable latch 16 is configured to move from the first position to the second position if a force applied from a notch 22 of the memory module 20 to the at least one pivotable latch 16 is above the pre-determined force threshold.

Example 6 may include the subject matter of example 5, wherein the at least one pivotable latch includes a holding portion 16*a*, wherein the holding portion 16*a* is configured to lock into a notch 22 of the memory module 20 if the at least one pivotable latch 16 is in the first position, and wherein the holding portion includes a holding portion surface 16*b* configured to restrain the memory module 20 if the at least one pivotable latch 16 is in the first position, wherein the holding portion surface 16*b* is non-orthogonal to an oblong portion 16*c* of the at least one pivotable latch 16.

Example 7 may include the subject matter of example 6, wherein the memory module connector 10 is suitable for being attached to a printed circuit board, wherein the holding portion surface 16*b* is non-parallel to a main surface of the printed circuit board.

Example 8 may include the subject matter of one of the examples 6 or 7, wherein the holding portion surface 16*b* is slanted.

Example 9 may include the subject matter of one of the examples 6 or 7, wherein the holding portion surface 16*b* is rounded.

Example 10 may include the subject matter of one of the examples 6 to 8, wherein the memory module connector 10 is suitable for being attached to a printed circuit board, wherein an angle between a main surface of the printed circuit board and the holding portion surface 16*b* is larger than 10°.

Example 11 may include the subject matter of one of the examples 6 to 8, wherein the pre-determined force threshold is based on an angle between the printed circuit board and the holding portion surface 16*b*.

Example 12 may include the subject matter of one of the examples 6 to 11, wherein the holding portion surface 16*b* is configured to be in contact with the notch of the memory module 20 if the at least one pivotable latch 16 is in the first position.

Example 13 may include the subject matter of one of the examples 6 to 12, wherein the holding portion surface 16*b* is matched to a notch surface 22*a* of a notch 22 of the memory module 20.

Example 14 relates to a memory module 20 suitable for being inserted into a memory module receiving slot 12 of a memory module connector 10, wherein the memory module 20 includes at least one notch 22 suitable for inserting a restraining mechanism 14 of the memory module connector 10, wherein the at least one notch 22 includes a notch surface 22*a* configured to be in contact with the restraining mechanism 14 of the memory module connector 100, wherein the notch surface 22*a* is non-orthogonal to a side 24 of the memory module 20 including the at least one notch 22.

Example 15 may include the subject matter of example 14, wherein the notch surface 22*a* is non-parallel to a side of the memory module 20 including a plurality of signal contacts of the memory module 20.

Example 16 may include the subject matter of example 15, wherein an angle between the side 22 of the memory module 20 including the plurality of signal contacts of the memory module 20 and the notch surface 22*a* is larger than 10°.

Example 17 may include the subject matter of one of the examples 14 to 16, wherein the notch surface 22*a* is slanted.

Example 18 may include the subject matter of one of the examples 14 to 17, wherein the notch surface 22*a* forms a slope.

Example 19 may include the subject matter of one of the examples 14 or 15, wherein the notch surface 22*a* is rounded.

Example 20 may include the subject matter of one of the examples 14 to 18, wherein the notch surface 22*a* is matched to a holding portion surface 16*b* of holding portion 16 of the memory module connector 10.

Example 21 relates to a pivotable latch 16 for a restraining mechanism 14 of a memory module connector 10, the pivotable latch including a holding portion 16*a* for locking the pivotable latch 16 into a notch 22 of a memory module 20, wherein the holding portion includes a holding portion surface 16*b* for restraining the memory module 20, wherein the holding portion surface 16*b* is non-orthogonal to an oblong portion 16*c* of the at least one pivotable latch 16.

Example 22 may include the subject matter of example 21, wherein the memory module connector 10 is suitable for being attached to a printed circuit board, wherein the holding portion surface 16*b* is non-parallel to a main surface of the printed circuit board.

Example 23 may include the subject matter of one of the examples 21 or 22, wherein the holding portion surface 16*b* is slanted.

Example 24 may include the subject matter of one of the examples 21 or 22, wherein the holding portion surface 16*b* is rounded.

Example 25 may include the subject matter of one of the examples 21 to 23, wherein the memory module connector 10 is suitable for being attached to a printed circuit board, wherein an angle between a main surface of the printed circuit board and the holding portion surface 16*b* is larger than 10°.

Example 26 may include the subject matter of one of the examples 21 to 25, wherein the holding portion surface 16*b* is matched to a notch surface 22*a* of a notch 22 of the memory module 20.

Example 27 relates to an apparatus 10 for connecting a memory module 20. The apparatus 10 includes a means for receiving a memory module 12 configured for receiving a memory module 20. The apparatus 10 includes a means for restraining 14 configured for releasing the memory module 20 if a force applied by the memory module 20 to the means for restraining 14 is above a pre-determined force threshold.

Example 28 may include the subject matter of example 27, wherein the apparatus 10 is suitable for being attached to a printed circuit board, wherein the means for restraining 14 is configured for releasing the memory module 20 if a shock force is applied to the printed circuit board.

Example 29 may include the subject matter of one of the examples 27 or 28, wherein the force is directed in a direction the memory module 20 is released to from the means for receiving a memory module 12.

Example 30 may include the subject matter of one of the examples 27 to 29, wherein the means for restraining 14 includes at least one pivotable latch 16.

Example 31 may include the subject matter of example 30, wherein the at least one pivotable latch 16 is configured for moving between a first position and a second position, wherein the first position of the at least one pivotable latch 16 is suitable for restraining the memory module within the memory receiving slot, wherein the second position of the at least one pivotable latch 16 is suitable for releasing the memory module from the means for receiving a memory module 12, and wherein the at least one pivotable latch 16 is configured for moving from the first position to the second position if a force applied from a notch 22 of the memory module 20 to the at least one pivotable latch 16 is above the pre-determined force threshold.

Example 32 may include the subject matter of example 31, wherein the at least one pivotable latch includes a holding portion 16a, wherein the holding portion 16a is configured for locking into a notch 22 of the memory module 20 if the at least one pivotable latch 16 is in the first position, and wherein the holding portion includes a holding portion surface 16b configured for restraining the memory module 20 if the at least one pivotable latch 16 is in the first position, wherein the holding portion surface 16b is non-orthogonal to an oblong portion 16c of the at least one pivotable latch 16.

Example 33 may include the subject matter of example 32, wherein the apparatus 10 is suitable for being attached to a printed circuit board, wherein the holding portion surface 16b is non-parallel to a main surface of the printed circuit board.

Example 34 may include the subject matter of one of the examples 32 or 33, wherein the holding portion surface 16b is slanted.

Example 35 may include the subject matter of one of the examples 32 or 33, wherein the holding portion surface 16b is rounded.

Example 36 may include the subject matter of one of the examples 32 to 34, wherein the apparatus 10 is suitable for being attached to a printed circuit board, wherein an angle between a main surface of the printed circuit board and the holding portion surface 16b is larger than 10°.

Example 37 may include the subject matter of one of the examples 32 to 36, wherein the pre-determined force threshold is based on an angle between the printed circuit board and the holding portion surface 16b.

Example 38 may include the subject matter of one of the examples 32 to 37, wherein the holding portion surface 16b is configured for being in contact with the notch of the memory module 20 if the at least one pivotable latch 16 is in the first position.

Example 39 may include the subject matter of one of the examples 32 to 38, wherein the holding portion surface 16b is matched to a notch surface 22a of a notch 22 of the memory module 20.

Example 40 relates to a method for a memory module connector 10. The method includes receiving 110 a memory module 20. The method includes releasing 120 the memory module 20 if a force applied by the memory module 20 to a restraining mechanism 14 of the memory module connector 10 is above a pre-determined force threshold.

Example 41 may include the subject matter of example 40, wherein the memory module connector 10 is suitable for being attached to a printed circuit board, wherein the memory module 20 is released if a shock force is applied to the printed circuit board.

Example 42 may include the subject matter of one of the examples 40 or 41, wherein the force is directed in a direction the memory module 20 is released to from a memory module receiving slot 12 of The method.

Example 43 may include the subject matter of one of the example 40 to 42, wherein the restraining mechanism 14 includes at least one pivotable latch 16.

Example 44 may include the subject matter of example 43, wherein the at least one pivotable latch 16 moves between a first position and a second position, wherein the first position of the at least one pivotable latch 16 is suitable for restraining the memory module within the memory receiving slot, wherein the second position of the at least one pivotable latch 16 is suitable for releasing the memory module from the memory module receiving slot 12, and wherein the at least one pivotable latch 16 moves from the first position to the second position if a force applied from a notch 22 of the memory module 20 to the at least one pivotable latch 16 is above the pre-determined force threshold.

Example 45 may include the subject matter of example 44, wherein the at least one pivotable latch includes a holding portion 16a, wherein the holding portion 16a is suitable for locking into a notch 22 of the memory module 20 if the at least one pivotable latch 16 is in the first position, and wherein the holding portion includes a holding portion surface 16b for restraining the memory module 20 if the at least one pivotable latch 16 is in the first position, wherein the holding portion surface 16b is non-orthogonal to an oblong portion 16c of the at least one pivotable latch 16.

Example 46 may include the subject matter of example 45, wherein the memory module connector 10 is suitable for being attached to a printed circuit board, wherein the holding portion surface 16b is non-parallel to a main surface of the printed circuit board.

Example 47 may include the subject matter of one of the examples 45 or 46, wherein the holding portion surface 16b is slanted.

Example 48 may include the subject matter of one of the examples 45 or 47, wherein the holding portion surface 16b is rounded.

Example 49 may include the subject matter of one of the examples 45 to 47, the memory module connector 10 is suitable for being attached to a printed circuit board, wherein an angle between a main surface of the printed circuit board and the holding portion surface 16b is larger than 10°.

Example 50 may include the subject matter of one of the examples 45 to 47, wherein the pre-determined force threshold is based on an angle between the printed circuit board and the holding portion surface 16b.

Example 51 may include the subject matter of one of the examples 45 to 50, wherein the holding portion surface 16b is suitable for being in contact with the notch of the memory module 20 if the at least one pivotable latch 16 is in the first position.

Example 52 may include the subject matter of one of the examples 45 to 51, wherein the holding portion surface 16b is matched to a notch surface 22a of a notch 22 of the memory module 20.

Example 53 relates to a method 600 for forming a memory module connector 10. The method 600 includes forming 610 a memory module receiving slot 12 configured to receive a memory module 20. The method 600 includes forming 620 a restraining mechanism 14 configured to release the memory module 20 if a force applied by the memory module 20 to the restraining mechanism 14 is above a pre-determined force threshold.

Example 54 may include the subject matter of example 53, wherein the memory module connector 10 is suitable for being attached to a printed circuit board, wherein the restraining mechanism 14 is configured to release the memory module 20 if a shock force is applied to the printed circuit board.

Example 55 may include the subject matter of one of the examples 53 or 54, wherein the force is directed in a direction the memory module 20 is released to from the memory module receiving slot 12.

Example 56 may include the subject matter of one of the examples 53 to 55, wherein the restraining mechanism 14 includes at least one pivotable latch 16.

Example 57 may include the subject matter of example 56, wherein the at least one pivotable latch 16 is configured to move between a first position and a second position, wherein the first position of the at least one pivotable latch 16 is suitable for restraining the memory module within the memory receiving slot, wherein the second position of the at least one pivotable latch 16 is suitable for releasing the memory module from the memory module receiving slot 12, and wherein the at least one pivotable latch 16 is configured to move from the first position to the second position if a force applied from a notch 22 of the memory module 20 to the at least one pivotable latch 16 is above the pre-determined force threshold.

Example 58 may include the subject matter of example 57, wherein the at least one pivotable latch includes a holding portion 16a, wherein the holding portion 16a is configured to lock into a notch 22 of the memory module 20 if the at least one pivotable latch 16 is in the first position, and wherein the holding portion includes a holding portion surface 16b configured to restrain the memory module 20 if the at least one pivotable latch 16 is in the first position, wherein the holding portion surface 16b is non-orthogonal to an oblong portion 16c of the at least one pivotable latch 16.

Example 59 may include the subject matter of example 58, wherein the memory module connector 10 is suitable for being attached to a printed circuit board, wherein the holding portion surface 16b is non-parallel to a main surface of the printed circuit board.

Example 60 may include the subject matter of one of the examples 58 or 59, wherein the holding portion surface 16b is slanted.

Example 61 may include the subject matter of one of the examples 58 or 59, wherein the holding portion surface 16b is rounded.

Example 62 may include the subject matter of one of the examples 58 to 60, wherein the memory module connector 10 is suitable for being attached to a printed circuit board, wherein an angle between a main surface of the printed circuit board and the holding portion surface 16b is larger than 10°.

Example 63 may include the subject matter of one of the examples 58 to 60, wherein the pre-determined force threshold is based on an angle between the printed circuit board and the holding portion surface 16b.

Example 64 may include the subject matter of one of the examples 58 to 63, wherein the holding portion surface 16b is configured to be in contact with the notch of the memory module 20 if the at least one pivotable latch 16 is in the first position.

Example 65 may include the subject matter of one of the examples 58 to 64, wherein the holding portion surface 16b is matched to a notch surface 22a of a notch 22 of the memory module 20.

Example 66 relates to a method 700 for forming a memory module 20 suitable for being inserted into a memory module receiving slot 12 of a memory module connector 10. The method includes forming 710 the memory module 20, wherein the memory module 20 includes at least one notch 22 suitable for inserting a restraining mechanism 14 of the memory module connector 10, wherein the at least one notch 22 includes a notch surface 22a configured to be in contact with the restraining mechanism 14 of the memory module connector 100, wherein the notch surface 22a is non-orthogonal to a side 24 of the memory module 20 including the at least one notch 22.

Example 67 may include the subject matter of example 66, wherein the notch surface 22a is non-parallel to a side of the memory module 20 including a plurality of signal contacts of the memory module 20.

Example 68 may include the subject matter of example 67, wherein an angle between the side 22 of the memory module 20 including the plurality of signal contacts of the memory module 20 and the notch surface 22a is larger than 10°.

Example 69 may include the subject matter of one of the examples 66 to 68, wherein the notch surface 22a is slanted.

Example 70 may include the subject matter of one of the examples 66 to 69, wherein the notch surface 22a forms a slope.

Example 71 may include the subject matter of one of the examples 66 or 67, wherein the notch surface 22a is rounded.

Example 72 may include the subject matter of one of the examples 66 to 71, wherein the notch surface 22a is matched to a holding portion surface 16b of holding portion 16 of the memory module connector 10.

Example 73 relates to a machine readable storage medium including program code, when executed, to cause a machine to perform the method of one of the examples 53 to 72.

Example 74 relates to a computer program having a program code for performing the method of at least one of the examples 53 to 72, when the computer program is executed on a computer, a processor, or a programmable hardware component.

Example 75 relates to a machine readable storage including machine readable instructions, when executed, to implement a method or realize an apparatus as claimed in any previous example.

Example 76 relates to a system including the memory module connector 10 according to one of the examples 1 to 13 and the memory module 20 according to one of the examples 14 to 20.

Example 77 relates to a system including the apparatus 10 for connecting a memory module 20 according to one of the examples 27 to 39 and the memory module 20 according to one of the examples 14 to 20.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A memory module connector comprising:
    a memory module receiving slot configured to receive a memory module; and
    a restraining mechanism configured to release the memory module if a force applied by the memory module to the restraining mechanism is above a pre-determined force threshold,
    wherein the restraining mechanism comprises at least one pivotable latch, the pivotable latch comprising a holding portion configured to lock into a notch formed on a side of the memory module,
    wherein the holding portion comprises a slanted holding portion surface,
    wherein the slanted holding portion surface is slanted in a same angle as a slanted notch surface in the notch of the memory module, and the restraining mechanism and the memory module are in contact with each other in the notch only at the slanted holding portion surface and the slanted notch surface such that the pivotable latch is pushed in a side direction when the force is applied by the memory module to the restraining mechanism on the slanted holding portion surface.

2. The memory module connector according to claim 1, wherein the memory module connector is suitable for being attached to a printed circuit board, wherein the restraining mechanism is configured to release the memory module if a shock force is applied to the printed circuit board.

3. The memory module connector according to claim 1, wherein the force is directed in a direction the memory module is released to from the memory module receiving slot.

4. The memory module connector according to claim 1, wherein the at least one pivotable latch is configured to move between a first position and a second position,
    wherein the first position of the at least one pivotable latch is suitable for restraining the memory module within the memory module receiving slot, wherein the second position of the at least one pivotable latch is suitable for releasing the memory module from the memory module receiving slot, and
    wherein the at least one pivotable latch is configured to move from the first position to the second position if a force applied from the notch of the memory module to the at least one pivotable latch is above the pre-determined force threshold.

5. The memory module connector according to claim 1, wherein the memory module connector is suitable for being attached to a printed circuit board, wherein an angle between a main surface of the printed circuit board and the slanted holding portion surface is larger than 10°.

6. The memory module connector according to claim 5, wherein the pre-determined force threshold is based on an angle between the printed circuit board and the slanted holding portion surface.

7. The memory module connector according to claim 4, wherein the slanted holding portion surface is configured to be in contact with the notch of the memory module if the at least one pivotable latch is in the first position.

8. A memory module suitable for being inserted into a memory module receiving slot of a memory module connector, wherein the memory module comprising:

at least one notch formed on a side of the memory module and suitable for inserting a restraining mechanism of the memory module connector, wherein the at least one notch comprises a slanted notch surface configured to be in contact with a slanted holding portion surface of the restraining mechanism of the memory module connector, wherein the slanted notch surface is slanted in a same angle as the slanted holding portion surface of the restraining mechanism, and the restraining mechanism and the memory module are in contact with each other in the notch only at the slanted holding portion surface and the slanted notch surface such that a pivotable latch of the restraining mechanism is pushed in a side direction when a force is applied by the memory module to the restraining mechanism on the slanted holding portion surface.

9. The memory module according to claim 8, wherein the slanted notch surface is non-parallel to a side of the memory module comprising a plurality of signal contacts of the memory module.

10. The memory module according to claim 9, wherein an angle between the side of the memory module comprising the plurality of signal contacts of the memory module and the slanted notch surface is larger than 10°.

11. A pivotable latch for a restraining mechanism of a memory module connector, the pivotable latch comprising:

a holding portion for locking the pivotable latch into a notch formed on a side of a memory module, wherein the holding portion comprises a slanted holding portion surface for restraining the memory module, wherein the slanted holding portion surface is slanted in a same angle as a slanted notch surface in the notch of the memory module, and the restraining mechanism and the memory module are in contact with each other in the notch only at the slanted holding portion surface and the slanted notch surface such that the pivotable latch is pushed in a side direction when a force exceeding a predetermined threshold is applied to the restraining mechanism by the memory module on the slanted holding portion surface.

* * * * *